United States Patent [19]

Takahashi et al.

[11] 3,778,754

[45] Dec. 11, 1973

[54] SOCKET FOR INTEGRATED CIRCUIT

[75] Inventors: Toru Takahashi, Kohei Kaneko, both of Yokohama, Japan

[73] Assignee: Yamaichi Denki Kogyo, K.K. (Yamaichi Electric Mfg. Co. Ltd.), Tokyo, Japan

[22] Filed: Dec. 8, 1971

[21] Appl. No.: 205,867

[30] Foreign Application Priority Data

June 26, 1971 Japan ........................... 46/55455

[52] U.S. Cl. .......... 339/176 M, 339/17 CF, 339/19, 317/101 A

[51] Int. Cl. ............................................ H01r 13/50

[58] Field of Search ................ 339/14, 17 R, 17 CF, 339/17 L, 17 LM, 176 MP, 18 R, 18 C, 19, 176 M; 317/101 A, 101 C, 101 CC; 174/DIG. 3

[56] References Cited

UNITED STATES PATENTS 3,656,183 4/1972 Walterscheid ................. 339/17 CA 3,587,029 6/1971 Knowles ............................... 339/14

3,543,226 11/1970 LaBove ....................... 339/176 MP

*Primary Examiner*—Marvin A. Champion
*Assistant Examiner*—Robert A. Hafer
*Attorney*—E. F. Wenderoth et al.

[57] ABSTRACT

An insulated baseboard has a power bus line and a ground bus line molded therein. Extending downwardly through the baseboard from the bus lines are wiring terminals. A plurality of openings are molded into the baseboard. Fitted into the openings are a plurality of contactors, the top ends of which have means to engage terminals of the integrated circuits, and the lower ends of which extend downwardly through the baseboards. On opposite ends of the bus lines are formed terminals for attachment to power supply and ground conductors.

5 Claims, 8 Drawing Figures

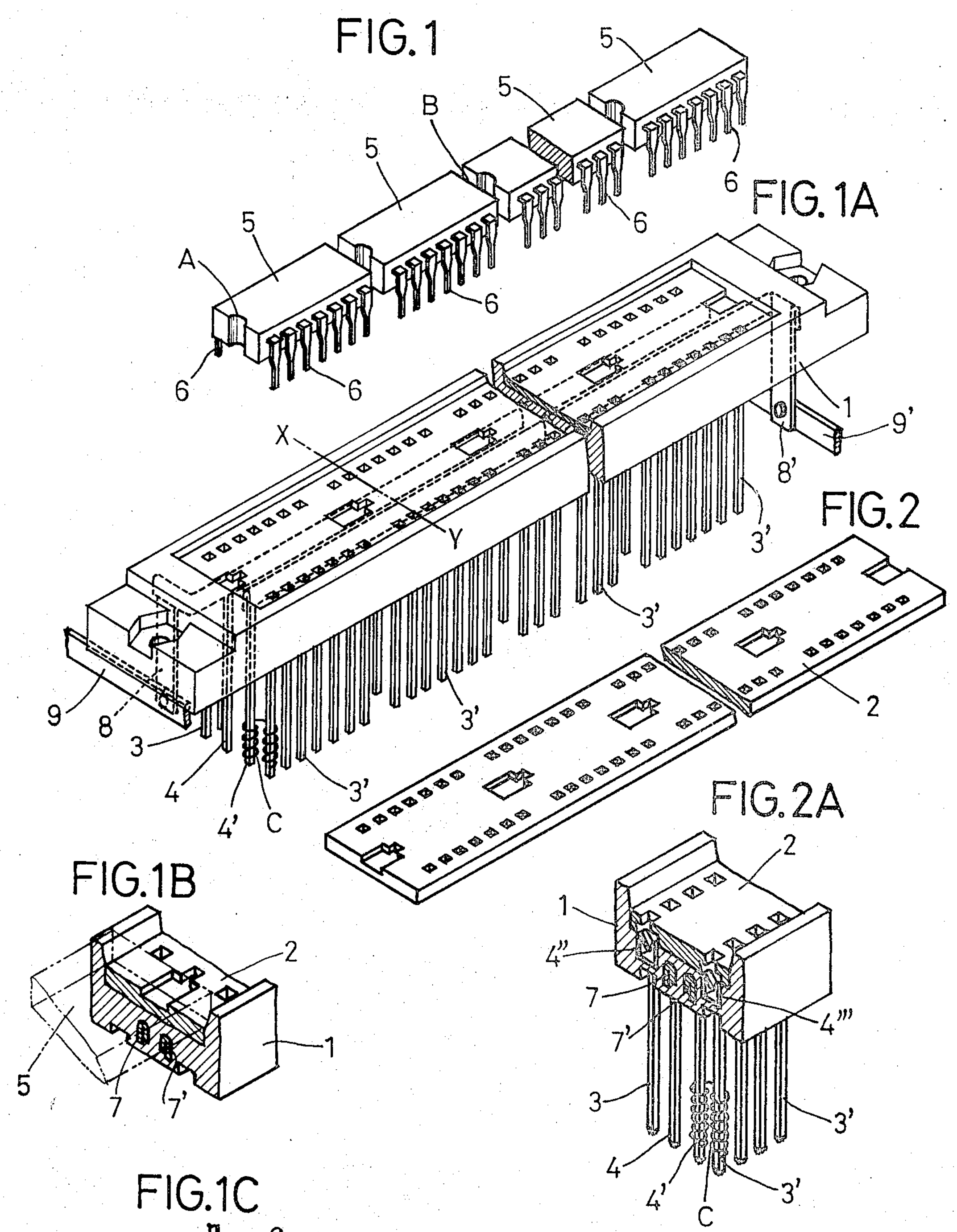
FIG. 1, FIG. 1A, FIG. 2, FIG. 1B, FIG. 2A, FIG. 1C
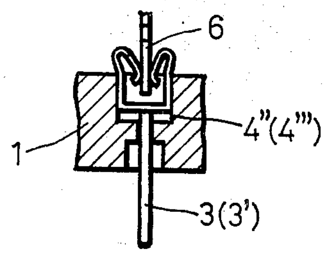
INVENTORS
TORU TAKAHASHI and
KOHEI KANEKO
BY Wenderoth, Lind & Ponack
ATTORNEYS

INVENTORS
TORU TAKAHASHI &
KOHEI KANEKO

BY Wenderoth, Lind & Ponack
ATTORNEYS

SOCKET FOR INTEGRATED CIRCUIT

BACKGROUND OF THE INVENTION

The present invention relates to a socket for receiving a plurality of desired integrated circuits. More particularly, the present invention is directed to such a socket which is capable of a higher electric current capacity.

In a great many present day electronic assemblies, it is very desirable to be able to use a desired plurality of integrated circuit components. In order to do so, it is necessary to have a suitable universal socket for receiving the desired integrated circuits. Many attempts in the past have been made to provide such a universal socket. However, for various reasons, all such prior art attempts have failed to produce an entirely satisfactory socket.

OBJECTS AND BRIEF DESCRIPTION OF THE INVENTION

With the above discussion in mind, it is a primary object of the present invention to provide a socket suitable for receiving any desired combination of integrated sockets to produce a desired electrical assembly.

It is a further object of the present invention to provide such a socket with an increased electric current capacity.

These objects are achieved in accordance with the present invention by the provision of a molded insulated baseboard. Molded within the baseboard are a power bus line and a ground bus line having wiring terminals extending therefrom through the bottom of the baseboard. Openings are molded in the baseboard to receive contactors for the terminals of the integrated circuits. The baseboard may be made as long as desired. The ends of the power bus line and the ground bus line are bent downwardly to form terminals which may be connected to power supply and ground conductors. A cover plate fits over the top of the baseboard and has holes therein aligning with the contactors. A suitable number of integrated circuits may be attached to the baseboard such that the terminals of the integrated circuits engage the contactors of the baseboard. The wiring terminals may then be suitably wired to the contactors to provide any desired electrical pattern.

Other objects and features of the present invention will be made clear by the following detailed description taken together with the accompanying drawings.

BRIEF DESCRIPTION OF THE DRAWINGS

FIG. 1 is a perspective view of a plurality of integrated circuits to be used with the socket of the present invention;

FIG. 1A is a perspective view of the socket of the present invention;

FIG. 1B is a perspective view, partially in cross-section, of the baseboard of the socket of the present invention;

FIG. 1C is a view partially in cross-section illustrating the relationship of the baseboard, the contactor and the integrated circuit terminal;

FIG. 2 is a perspective view illustrating the cover plate in accordance with the present invention;

FIG. 2A is a perspective view of the present invention taken along line X–Y of FIG. 1A;

DETAILED DESCRIPTION OF THE INVENTION

Figure 3:
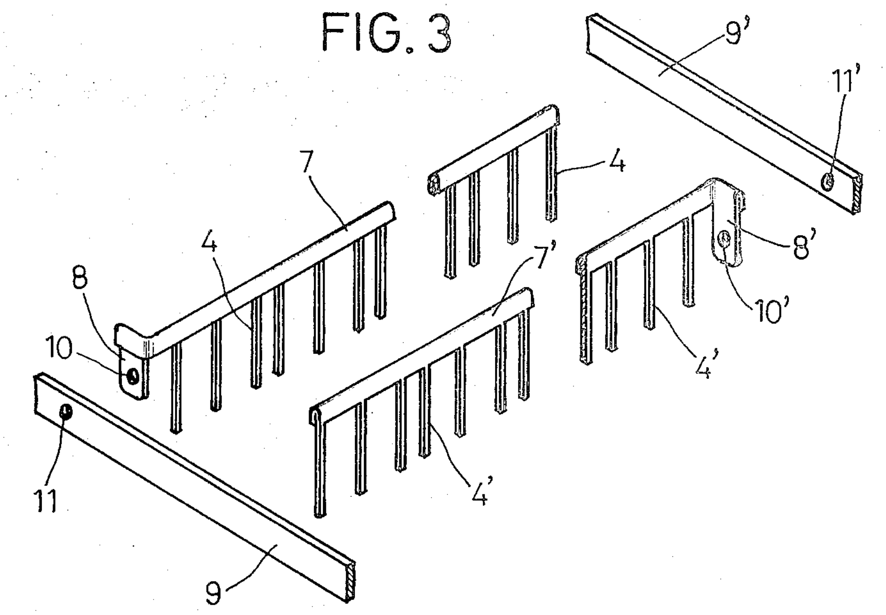
FIG. 3 is a perspective view with portions broken away of the power and ground bus lines and the power supply and ground conductors in accordance with the present invention.

With reference to the drawings, the socket of the present invention will now be described in more detail.

An insulated baseboard 1 may be molded from any suitable electrical insulating material to have a desired longitudinal dimension. Molded within the baseboard 1 and extending in the longitudinal direction thereof are a power bus line 7 and a ground bus line 7'. The power bus line at one end of the baseboard is bent downwardly to form a terminal 8. At the end of the ground bus line 7' opposite terminal 8 is a bent down portion to form a terminal 8'. Terminal 8 may be attached by suitable means such as nut and bolt through holes 10 and 11 to a power supply conductor 9. Similarly terminal 8' may be connected by suitable means through holes 10' and 11' to ground conductor 9'. As will be seen in FIG. 4, a plurality of baseboards 1 may be attached to conductors 9 and 9' by means of terminals 8 and 8'. The baseboards may then be attached to a suitable frame 12 in any desired manner.

Extending downwardly through the bottom of baseboard 1 from power and ground bus lines 7 and 7' are a plurality of wiring terminals 4 and 4', respectively.

Also molded into baseboard 1 and extending in lines parallel to the power and ground bus lines are a plurality of contactor openings. These openings are dimensioned to receive a plurality of contactors 3 and 3'. The lower ends of these contactors extend downwardly through the bottom of the baseboard, and the upper ends of the contactors have suitable clip or attachment means to receive in electrical contact relationship terminals 6 of integrated circuits 5.

As is apparent from FIG. 3 of the drawings, power bus line 7, terminal 8 and wiring terminals 4 are preferably formed from a single sheet of material such as metal. Similarly ground bus line 7', terminal 8' and wiring terminals 4' are formed from a single element, such as a metal sheet.

A suitable insulating cover plate 2 has a plurality of holes to align with contactors 3 and 3' and fits over the top of baseboard 1.

Figure 4:
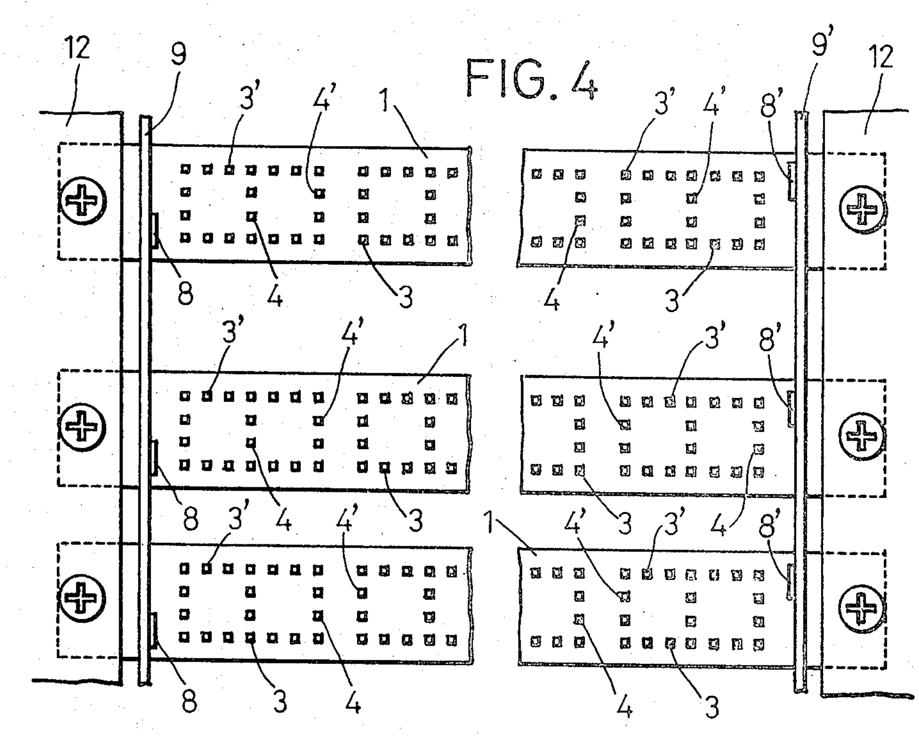
FIG. 4 is a bottom view with portions broken away of a complete assembly in accordance with the present invention.

As shown in FIGS. 1A and 2A, and as is apparent from FIG. 4, any suitable electronic pattern may be developed when the integrated circuits are assembled to the socket by selectively wiring contactors 3 and 3' to desired wiring terminals 4 and 4'. By the provision of the power bus line and the ground bus line on opposite sides of the socket, the electric current capacity of the unit is increased. Cover plate 2 is fitted to the top of baseboard 1 to facilitate insertion of terminals 6 into the socket holes and contact with the contactors 3 and 3'.

It will be apparent that the arrangement of the socket of the present invention greatly simplifies the structure necessary in building the electronic system of any piece of electronic equipment. Furthermore, redesign and alteration of this electronic equipment may readily be made by means of the socket of the present invention.

Although a preferred embodiment of the present invention has been described in detail, it will be apparent that such description is intended to be illustrative only and not limiting since many specific details and features of the present invention may be modified without departing from the spirit and scope thereof.

What is claimed is:

1. A socket for integrated circuits comprising an insulated baseboard, a power bus line embedded in said baseboard and and a ground bus line extending on opposite sides through said baseboard along a longitudinal dimension thereof, a plurality of wiring terminals electrically connected to said bus lines and extending downwardly from said bus lines through said baseboard, said baseboard having a plurality of openings therein, a plurality of contactors fitted in said openings for engaging the terminals of integrated circuits, and terminals on opposite ends of said power bus line and said ground bus line for connection to power supply and ground conductors, respectively.

2. A socket as claimed in claim 1, wherein each of said contactors has a lower end extending through said baseboard and an upper end having a clip for engaging said intergrated circuit terminals.

3. A socket as claimed in claim 2 wherein said terminals include a bent portion on said power bus line adjacent a first end of said baseboard and a bent portion on said ground bus line adjacent the opposite end of said baseboard.

4. A socket as claimed in claim 3, further comprising an insulating cover plate fitting over said baseboard and having holes aligning with said openings.

5. A socket as claimed in claim 1, wherein each of said bus lines and the respective wiring terminals depending therefrom are integrally formed for a single metal sheet.

* * * * *